United States Patent
Lin et al.

(10) Patent No.: US 8,482,063 B2
(45) Date of Patent: Jul. 9, 2013

(54) HIGH VOLTAGE SEMICONDUCTOR DEVICE

(75) Inventors: An-Hung Lin, New Taipei (TW); Hong-Ze Lin, Hsinchu (TW); Bo-Jui Huang, Hsinchu (TW); Wei-Shan Liao, Yunlin County (TW); Ting-Zhou Yan, Kaohsiung (TW); Wei-Chun Chang, Kaohsiung (TW); Chun-Yao Lee, New Taipei (TW); Kun-Yi Chou, New Taipei (TW)

(73) Assignee: United Microelectronics Corporation, Hsinchu (TW)

( * ) Notice: Subject to any disclaimer, the term of this patent is extended or adjusted under 35 U.S.C. 154(b) by 0 days.

(21) Appl. No.: 13/299,446

(22) Filed: Nov. 18, 2011

(65) Prior Publication Data

US 2013/0126968 A1   May 23, 2013

(51) Int. Cl.
   *H01L 29/66*   (2006.01)
(52) U.S. Cl.
   USPC ............ 257/335; 257/213; 257/327; 257/288
(58) Field of Classification Search
   USPC .......................... 257/335, 327, 228, 213, 288
   See application file for complete search history.

(56) References Cited

U.S. PATENT DOCUMENTS

| | | | |
|---|---|---|---|
| 4,344,081 A | 8/1982 | Pao | |
| 4,396,999 A | 8/1983 | Malaviya | |
| 4,893,160 A | 1/1990 | Blanchard | |
| 4,918,333 A | 4/1990 | Anderson | |
| 4,958,089 A | 9/1990 | Fitzpatrick | |
| 5,040,045 A | 8/1991 | McArthur | |
| 5,268,589 A | 12/1993 | Dathe | |
| 5,296,393 A | 3/1994 | Smayling | |
| 5,326,711 A | 7/1994 | Malhi | |
| 5,346,835 A | 9/1994 | Malhi | |
| 5,430,316 A | 7/1995 | Contiero | |
| 5,436,486 A | 7/1995 | Fujishima | |
| 5,534,721 A | 7/1996 | Shibib | |
| 5,811,850 A | 9/1998 | Smayling | |
| 5,950,090 A | 9/1999 | Chen | |
| 5,998,301 A | 12/1999 | Pham | |
| 6,066,884 A | 5/2000 | Krutsick | |
| 6,144,538 A | 11/2000 | Chao | |
| 6,165,846 A | 12/2000 | Carns | |
| 6,245,689 B1 | 6/2001 | Hao | |
| 6,277,675 B1 | 8/2001 | Tung | |
| 6,277,757 B1 | 8/2001 | Lin | |
| 6,297,108 B1 | 10/2001 | Chu | |
| 6,306,700 B1 | 10/2001 | Yang | |

(Continued)

*Primary Examiner* — N Drew Richards
*Assistant Examiner* — Jay C Chang
(74) *Attorney, Agent, or Firm* — WPAT, PC; Justin King

(57) ABSTRACT

A high voltage semiconductor device is provided. A first-polarity buried layer is formed in the substrate. A first high voltage second-polarity well region is located over the first-polarity buried layer. A second-polarity base region is disposed within the first high voltage second-polarity well region. A source region is disposed within the second-polarity base region. A high voltage deep first-polarity well region is located over the first-polarity buried layer and closely around the first high voltage second-polarity well region. A first-polarity drift region is disposed within the high voltage deep first-polarity well region. A gate structure is disposed over the substrate. A second high voltage second-polarity well region is located over the first-polarity buried layer and closely around the high voltage deep first-polarity well region. A deep first-polarity well region is located over the first-polarity buried layer and closely around the second high voltage second-polarity well region.

13 Claims, 5 Drawing Sheets

U.S. PATENT DOCUMENTS

| | | |
|---|---|---|
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 7,808,069 B2 | 10/2010 | Ho et al. |
| 2003/0022460 A1 | 1/2003 | Park |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0261407 A1 | 11/2006 | Blanchard |
| 2006/0261408 A1 * | 11/2006 | Khemka et al. ............... 257/335 |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |

* cited by examiner

_US 8,482,063 B2_

HIGH VOLTAGE SEMICONDUCTOR DEVICE

FIELD OF THE INVENTION

The present invention relates to a high voltage semiconductor device, and more particularly to a high voltage metal oxide semiconductor device.

BACKGROUND OF THE INVENTION

Nowadays, in the mainstream of integrated circuit production, a power semiconductor device withstanding a high voltage or high current and an analog or digital circuit operating at a low voltage are integrated into the same integrated circuit chip. The integration of the power semiconductor device and the analog or digital circuit will gradually replace the conventional distributed circuit because the distributed circuit is bulky and costly.

For example, a lateral diffused MOSFET transistor (also referred as a LDMOS transistor) is a metal oxide semiconductor device capable of withstanding a high voltage. In the LDMOS transistor, a channel region is laterally extended in a direction parallel with a surface of a substrate. FIG. 1 schematically illustrates an equivalent circuit of a lateral diffused MOSFET transistor. As shown in FIG. 1, both ends of an equivalent diode 10 are respectively connected to the source terminal and the drain terminal of the lateral diffused MOSFET transistor. That is, the equivalent diode 10 denotes the breakdown voltage of the lateral diffused MOSFET transistor.

In the practical applications, the integrated circuit chip is usually connected with an external inductive load according to the circuitry requirement. During operations of the circuitry, the diode 10 is readily suffered from an unexpected high voltage. If the unexpected high voltage exceeds the rated operating voltage of the lateral diffused MOSFET transistor, an over-current may burn out the lateral diffused MOSFET transistor. Therefore, there is a need of providing an improved high voltage semiconductor device so as to obviate the above drawbacks.

SUMMARY OF THE INVENTION

In accordance with an aspect, the present invention provides a high voltage semiconductor device. The high voltage semiconductor device includes a substrate, a first-polarity buried layer, a first high voltage second-polarity well region, a second-polarity base region, a source region, a high voltage deep first-polarity well region, a first-polarity drift region, a gate structure, a second high voltage second-polarity well region, and a deep first-polarity well region. The first-polarity buried layer is formed in the substrate. The first high voltage second-polarity well region is formed in the substrate, and located over the first-polarity buried layer. The second-polarity base region is formed in the substrate, and disposed within the first high voltage second-polarity well region. The source region is formed in the substrate, and disposed within the second-polarity base region. The high voltage deep first-polarity well region is formed in the substrate, and located over the first-polarity buried layer and closely around the first high voltage second-polarity well region. The first-polarity drift region is formed in the substrate, and disposed within the high voltage deep first-polarity well region. The gate structure is disposed over the substrate, and located around the source region. The second high voltage second-polarity well region is formed in the substrate, and located over the first-polarity buried layer and closely around the high voltage deep first-polarity well region. The deep first-polarity well region is formed in the substrate, and located over the first-polarity buried layer and closely around the second high voltage second-polarity well region.

In an embodiment, the first-polarity is N-type, and the second-polarity is P-type.

In an embodiment, a second-polarity dopant concentration of the second-polarity base region is higher than a second-polarity dopant concentration of the first high voltage second-polarity well region.

In an embodiment, the high voltage semiconductor device further includes a body contact region, which is formed in the substrate and surrounded by the source region, wherein the source region comprises a source contact region.

In an embodiment, a first-polarity dopant concentration of the first-polarity drift region is higher than a first-polarity dopant concentration of the high voltage deep first-polarity well region.

In an embodiment, the high voltage semiconductor device further includes a shallow trench isolation structure, which is arranged between the gate structure and the first-polarity drift region.

In an embodiment, the high voltage semiconductor device further includes a drain contact region, which is disposed within the first-polarity drift region.

In an embodiment, the high voltage semiconductor device further includes a body contact region, which is disposed within the second high voltage second-polarity well region.

In an embodiment, the high voltage semiconductor device further includes a guard ring contact region, which is disposed within the deep first-polarity well region.

In an embodiment, the high voltage semiconductor device further includes a deep second-polarity well region. The deep second-polarity well region is arranged between the high voltage deep first-polarity well region and the first-polarity buried layer, and laterally extended and connected to the first high voltage second-polarity well region and the second high voltage second-polarity well region.

In an embodiment, a second-polarity dopant concentration of the deep second-polarity well region is higher than a first-polarity dopant concentration of the high voltage deep first-polarity well region and a second-polarity dopant concentration of the first high voltage second-polarity well region.

In an embodiment, the deep second-polarity well region has a race-track structure.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
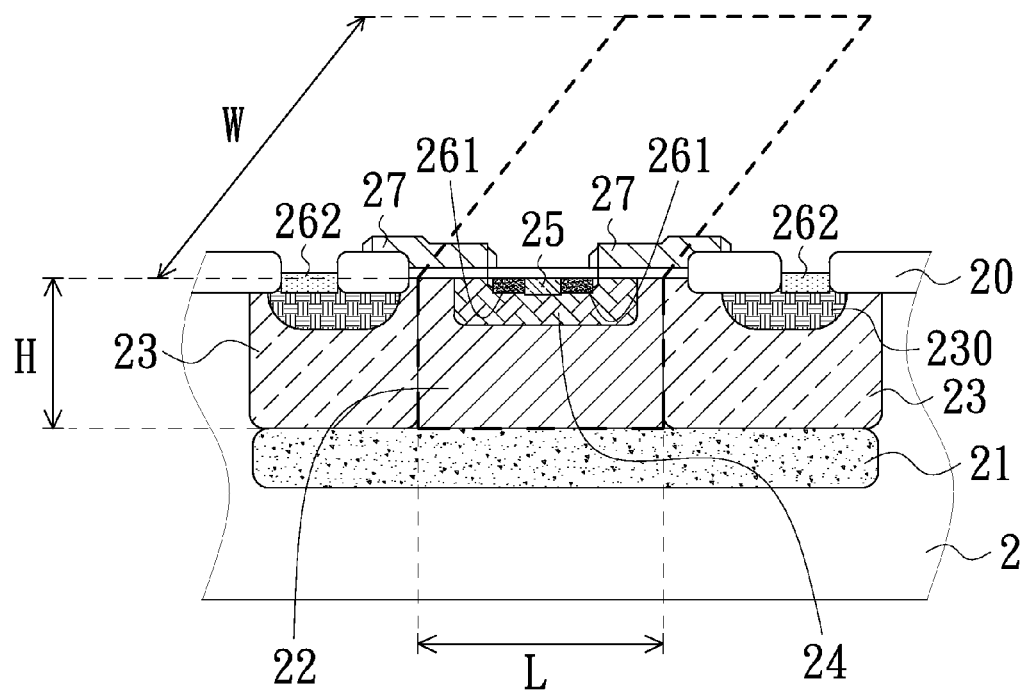
FIG. 2A is a schematic cross-sectional view illustrating a lateral diffused MOSFET transistor according to an embodiment of the present invention.

FIG. 2A is a schematic cross-sectional view illustrating a lateral diffused MOSFET transistor according to an embodiment of the present invention. The lateral diffused MOSFET transistor is also referred as a LDMOS transistor. As shown in FIG. 2A, an isolation structure 20, an N-type buried layer 21, a high voltage P-well region 22, a high voltage deep N-well region 23, an N-drift region 230, a P-base region 24, a heavily P-doped region 25, two heavily N-doped regions 261, 262 are constructed in the substrate 2. In addition, a gate structure 27 is formed over the substrate 2. The isolation structure 20 is for example a shallow trench isolation (STI) structure. The heavily P-doped region 25 is served as a body contact region. Moreover, the heavily N-doped region 261 is served as a source contact region, and the heavily N-doped region 262 is served as a drain contact region.

Figure 2B:
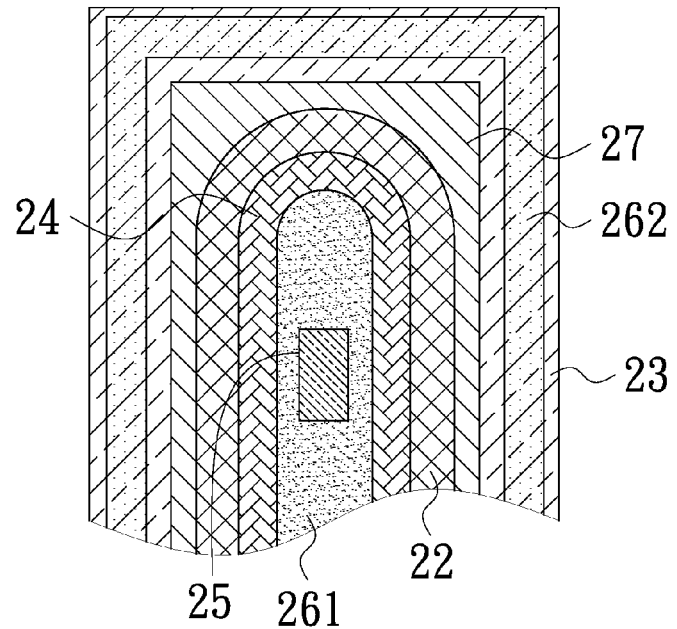
FIG. 2B is a schematic top view illustrating the lateral diffused MOSFET transistor of FIG. 2A.

FIG. 2B is a schematic top view illustrating the lateral diffused MOSFET transistor of FIG. 2A. In this embodiment, the lateral diffused MOSFET transistor is a lateral diffused NMOS transistor (also referred as a LDNMOS transistor) with race-track structures. As shown in FIG. 2B, the body contact region 25 is surrounded by a plurality of race-track structures in a ring-shaped configuration, wherein the race-track structures have round corners or right-angle corners. From the inner track to the outer track, the body contact region 25 is surrounded by the heavily N-doped region 261, the P-base region 24, the gate structure 27, the high voltage P-well region 22, the high voltage deep N-well region 23 and the heavily N-doped region 262 successively. It is noted that the number of the body contact region 25 may be varied according to the practical requirements. In some embodiments, the lateral diffused MOSFET transistor has a plurality of body contact regions 25. For clarification and brevity, only one body contact region 25 is shown in the drawings.

Figure 1:
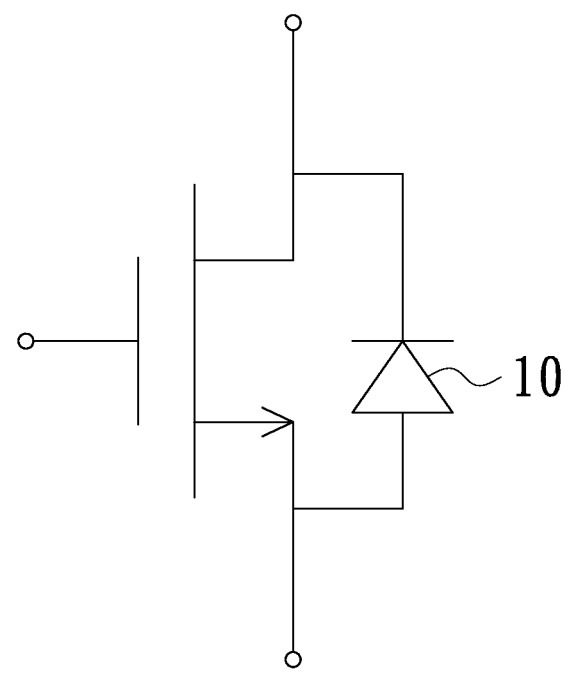
FIG. 1 schematically illustrates an equivalent circuit of a lateral diffused MOSFET transistor.

Please refer to FIGS. 2A and 2B again. The interfaces between the border and the bottom of the high voltage P-well region 22 and the neighboring N-type regions may be referred as P-N junctions. These P-N junctions act like the diode 10 as shown in FIG. 1. During operations of the circuitry, if the inductive load is suffered from an unexpected high voltage, a large magnitude of current is possibly generated. In this embodiment, the current is introduced into the source contact region 261, then transferred through the P-N junction between the high voltage P-well region 22 and the neighboring N-type regions (i.e. the high voltage deep N-well region 23 and the N-type buried layer 21), and finally discharged from the drain contact region 262. Generally, the total area of the P-N junctions is in direct proportion to the magnitude of the current that can be withstood by the diode 10 of FIG. 1. In the lateral diffused MOSFET transistor of this embodiment, the total area of the P-N junctions is determined according to the length, width and height of the high voltage P-well region 22. That is, the total area of the P-N junctions is equal to 2×(W×H+H×L)+W×L. For increasing the total area of the P-N junctions, some other exemplary lateral diffused MOSFET transistors will be illustrated as follows.

Figure 3A:
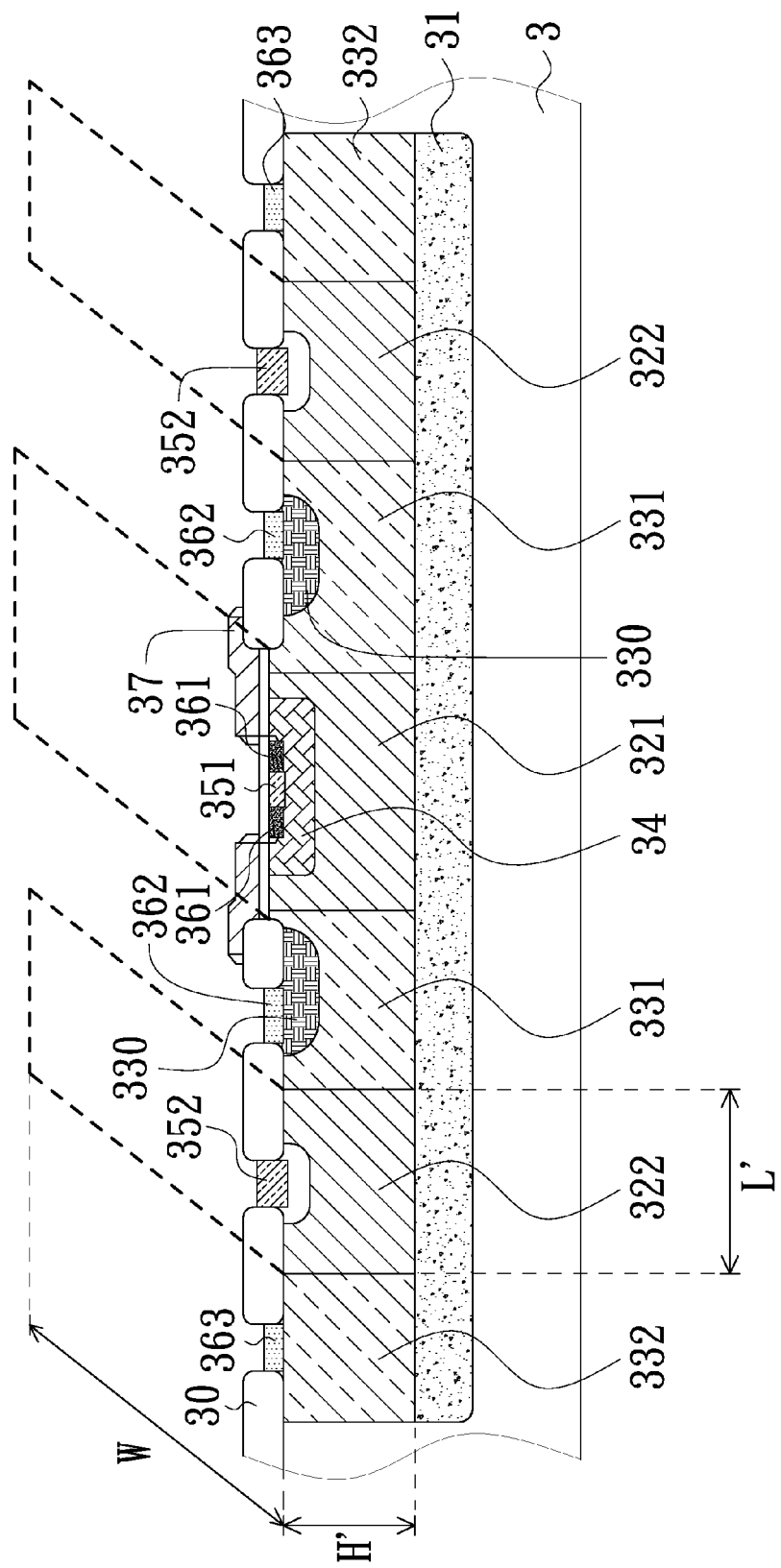
FIG. 3A is a schematic cross-sectional view illustrating a lateral diffused MOSFET transistor according to another embodiment of the present invention.

FIG. 3A is a schematic cross-sectional view illustrating a lateral diffused MOSFET transistor according to another embodiment of the present invention. The lateral diffused MOSFET transistor is also referred as a LDMOS transistor. As shown in FIG. 3A, an isolation structure 30, an N-type buried layer 31, a first high voltage P-well region 321, a second high voltage P-well region 322, a high voltage deep N-well region 331, an N-drift region 330, a deep N-well region 332, a P-base region 34, two heavily P-doped regions 351, 352, three heavily N-doped regions 361, 362, 363 are constructed in the substrate 3. In addition, a gate structure 37 is formed over the substrate 3. The heavily P-doped regions 351 and 352 are served as body contact regions. Moreover, the heavily N-doped region 361 is served as a source contact region, and the heavily N-doped regions 362 and 363 are served as a drain contact region and a guard ring contact region, respectively.

Figure 3B:
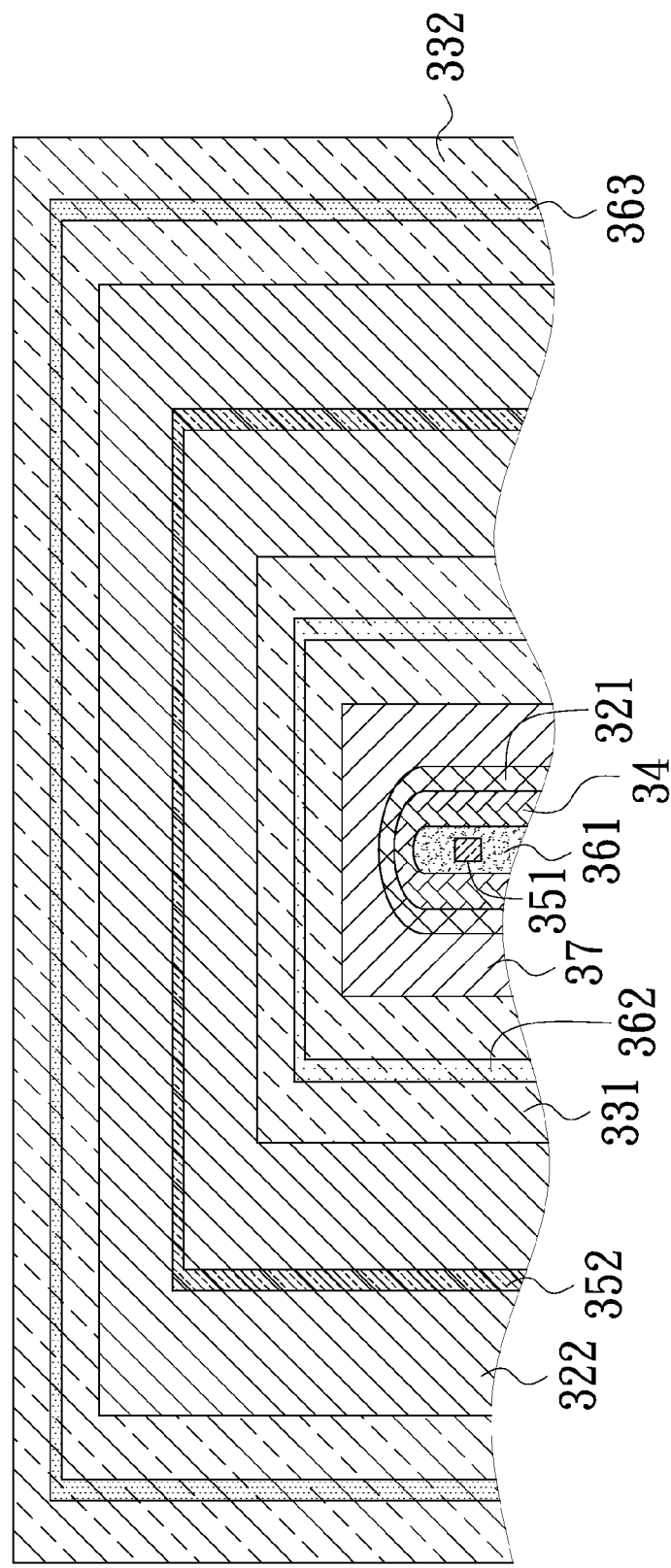
FIG. 3B is a schematic top view illustrating the lateral diffused MOSFET transistor of FIG. 3A.

FIG. 3B is a schematic top view illustrating the lateral diffused MOSFET transistor of FIG. 3A. In this embodiment, the lateral diffused MOSFET transistor is a lateral diffused NMOS transistor (also referred as a LDNMOS transistor) with race-track structures. As shown in FIG. 3B, the body contact region 351 is surrounded by a plurality of race-track structures in a ring-shaped configuration, wherein the race-track structures have round corners or right-angle corners. From the inner track to the outer track, the body contact region 351 is surrounded by the heavily N-doped region 361, the P-base region 34, the first high voltage P-well region 321, the gate structure 37, the high voltage deep N-well region 331, the heavily N-doped region 362, the second high voltage P-well region 322, the heavily P-doped region 352 and the heavily N-doped region 363 successively.

Please refer to FIGS. 3A and 3B again. In comparison with FIGS. 2A and 2B, the lateral diffused MOSFET transistor of this embodiment further comprises the second high voltage P-well region 322, the body contact region 352, the deep N-well region 332 (i.e. a guard ring), and the guard ring contact region 363. Consequently, the total area of the P-N junctions is largely increased.

During operations of the circuitry, if the inductive load is suffered from an unexpected high voltage, a large magnitude of current is possibly generated. In this embodiment, the current is introduced into the source contact region 361, then transferred through the P-N junctions between the first high voltage P-well region 321 and the second high voltage P-well region 322 and the neighboring N-type regions (i.e. the high voltage deep N-well region 331, the deep N-well region 332 and the N-type buried layer 31), and finally discharged from the drain contact region 362 and the guard ring contact region 363. Since the total area of the P-N junctions is largely increased, the lateral diffused MOSFET transistor can withstand a higher current.

Figure 4:
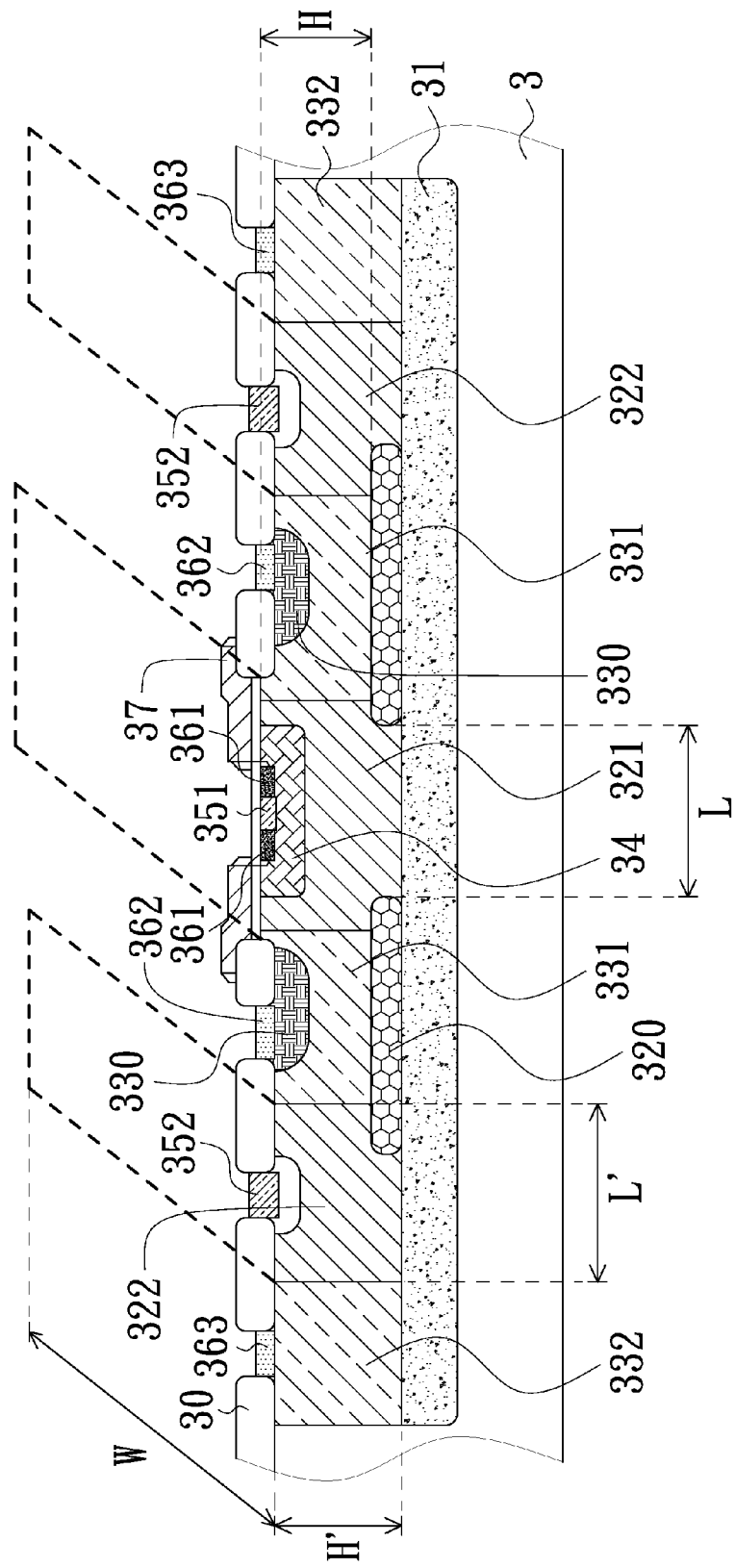
FIG. 4 is a schematic cross-sectional view illustrating a lateral diffused MOSFET transistor according to a further embodiment of the present invention.

FIG. 4 is a schematic cross-sectional view illustrating a lateral diffused MOSFET transistor according to a further embodiment of the present invention. The lateral diffused MOSFET transistor is also referred as a LDMOS transistor. In comparison with FIG. 3A, the lateral diffused MOSFET transistor of this embodiment further comprises a deep P-well region 320 with a race-track structure. The deep P-well region 320 is located under the high voltage deep N-well region 331. The high voltage deep N-well region 331 is separated from the N-type buried layer 31 by the deep P-well region 320. Moreover, the high voltage deep N-well region 331 is laterally extended and connected to the first high voltage P-well region 321 and the second high voltage P-well region 322. In comparison with FIG. 2A, the total area of the P-N junctions of this embodiment is increased by $2\times[2\times(W\times H'+H'\times L')+W\times L']$.

In the lateral diffused MOSFET transistor of the above embodiments, the N-type dopant concentration of the N-type buried layer is in the scale level of $10^{14}$ cm$^{-2}$, the dopant concentration of the high voltage P-well region is in the scale level of $10^{12}$ cm$^{-2}$, and the dopant concentration of the high voltage deep N-well region is in the scale level of $10^{12}$ cm$^{-2}$. Moreover, the dopant concentration of the deep P-well region 320 is higher than the dopant concentrations of the high voltage P-well region and the high voltage deep N-well region. Moreover, the dopant concentration of the P-base region is higher than the dopant concentration of the high voltage P-well region, and the dopant concentration of the N-drift region is higher than the dopant concentration of the high voltage deep N-well region.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A high voltage semiconductor device, comprising:
 a substrate;
 a first-polarity buried layer formed in the substrate;
 a first second-polarity well region formed in the substrate, and located over the first-polarity buried layer;
 a second-polarity base region formed in the substrate, and disposed within the first second-polarity well region;
 a source region formed in the substrate, and disposed within the second-polarity base region;
 a first first-polarity well region formed in the substrate, and located over the first-polarity buried layer and closely around the first second-polarity well region;
 a first-polarity drift region formed in the substrate, and disposed within the first first-polarity well region;
 a gate structure disposed over the substrate, and located around the source region;
 a second second-polarity well region formed in the substrate, and located over the first-polarity buried layer and closely around the first first-polarity well region;
 a second first-polarity well region formed in the substrate, and located over the first-polarity buried layer and closely around the second second-polarity well region; and
 a drain contact region disposed within the first-polarity drift region.

2. The high voltage semiconductor device according to claim 1, wherein the first-polarity is N-type, and the second-polarity is P-type.

3. The high voltage semiconductor device according to claim 1, wherein a second-polarity dopant concentration of the second-polarity base region is higher than a second-polarity dopant concentration of the first second-polarity well region.

4. The high voltage semiconductor device according to claim 1, further comprising a body contact region, which is formed in the substrate and surrounded by the source region, wherein the source region comprises a source contact region.

5. The high voltage semiconductor device according to claim 1, wherein a first-polarity dopant concentration of the first-polarity drift region is higher than a first-polarity dopant concentration of the first first-polarity well region.

6. The high voltage semiconductor device according to claim 1, further comprising a shallow trench isolation structure, which is arranged between the gate structure and the first-polarity drift region.

7. The high voltage semiconductor device according to claim 1, further comprising a body contact region, which is disposed within the second second-polarity well region.

8. The high voltage semiconductor device according to claim 1, further comprising a guard ring contact region, which is disposed within the second first-polarity well region.

9. The high voltage semiconductor device according to claim 1, further comprising a third second-polarity well region, wherein the third second-polarity well region is arranged between the first first-polarity well region and the first-polarity buried layer, and laterally extended and connected to the first second-polarity well region and the second second-polarity well region.

10. The high voltage semiconductor device according to claim 9, wherein a second-polarity dopant concentration of the third second-polarity well region is higher than a first-polarity dopant concentration of the first first-polarity well region and a second-polarity dopant concentration of the first second-polarity well region.

11. The high voltage semiconductor device according to claim 9, wherein the third second-polarity well region has a race-track structure.

12. The high voltage semiconductor device according to claim 1, wherein the second second-polarity well region directly contacts with the first-polarity buried layer.

13. The high voltage semiconductor device according to claim 1, wherein the second first-polarity well region directly contacts with the first-polarity buried layer.

* * * * *